US011561463B2

(12) United States Patent
Nakagawa et al.

(10) Patent No.: US 11,561,463 B2
(45) Date of Patent: Jan. 24, 2023

(54) SUBSTRATE WITH CONDUCTIVE FILM, SUBSTRATE WITH MULTILAYER REFLECTIVE FILM, REFLECTIVE MASK BLANK, REFLECTIVE MASK, AND SEMICONDUCTOR DEVICE MANUFACTURING METHOD

(71) Applicant: HOYA CORPORATION, Tokyo (JP)

(72) Inventors: Masanori Nakagawa, Tokyo (JP); Tsutomu Shoki, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 271 days.

(21) Appl. No.: 16/955,734

(22) PCT Filed: Dec. 21, 2018

(86) PCT No.: PCT/JP2018/047246
§ 371 (c)(1),
(2) Date: Jun. 18, 2020

(87) PCT Pub. No.: WO2019/131506
PCT Pub. Date: Jul. 4, 2019

(65) Prior Publication Data
US 2021/0103209 A1 Apr. 8, 2021

(30) Foreign Application Priority Data
Dec. 27, 2017 (JP) .............................. JP2017-251163

(51) Int. Cl.
G03F 1/24 (2012.01)
G03F 1/58 (2012.01)
H01L 21/033 (2006.01)

(52) U.S. Cl.
CPC .................. G03F 1/24 (2013.01); G03F 1/58 (2013.01); H01L 21/0332 (2013.01); H01L 21/0337 (2013.01)

(58) Field of Classification Search
None
See application file for complete search history.

(56) References Cited

U.S. PATENT DOCUMENTS

2002/0076625 A1   6/2002   Shoki et al.
2007/0160874 A1   7/2007   Hayashi et al.
(Continued)

FOREIGN PATENT DOCUMENTS

JP   2002222764 A   8/2002
JP       4978626 B   7/2012
(Continued)

OTHER PUBLICATIONS

PCT/JP2018/047246, "English translation of International Search Report", dated Mar. 19, 2019, 1 page.

Primary Examiner — Hsien Ming Lee
(74) Attorney, Agent, or Firm — Kilpatrick Townsend & Stockton LLP

(57) ABSTRACT

A substrate with a conductive film for manufacturing a reflective mask which has a rear-surface conductive film with high mechanical strength and is capable of correcting positional deviation of the reflective mask from the rear surface side by a laser beam or the like. A substrate with a conductive film has a conductive film formed on one surface of a main surface of a mask blank substrate used for lithography, wherein the conductive film includes a transparent conductive layer provided on a substrate side and an upper layer provided on the transparent conductive layer, the conductive film has a transmittance of 10% or more for light of wavelength 532 nm, the upper layer is made of a material including tantalum (Ta) and boron (B), and the upper layer has a film thickness of 0.5 nm or more and less than 10 nm.

23 Claims, 4 Drawing Sheets

(56) References Cited

U.S. PATENT DOCUMENTS

| | | | |
|---|---|---|---|
| 2009/0253055 A1 | 10/2009 | Hayashi et al. | |
| 2012/0009511 A1 | 1/2012 | Dmitriev | |
| 2014/0295330 A1 | 10/2014 | Pruneri et al. | |
| 2015/0301442 A1 | 10/2015 | Kageyama et al. | |
| 2017/0108766 A1* | 4/2017 | Bender | G03F 1/38 |

FOREIGN PATENT DOCUMENTS

| | | |
|---|---|---|
| JP | 5082857 B | 11/2012 |
| JP | 2013225662 A | 10/2013 |
| JP | 2015114356 A | 6/2015 |
| JP | 2015215602 A | 12/2015 |
| JP | 5883249 B | 2/2016 |
| JP | 6107829 B | 3/2017 |
| JP | 2017102475 A | 6/2017 |

* cited by examiner

SUBSTRATE WITH CONDUCTIVE FILM, SUBSTRATE WITH MULTILAYER REFLECTIVE FILM, REFLECTIVE MASK BLANK, REFLECTIVE MASK, AND SEMICONDUCTOR DEVICE MANUFACTURING METHOD

CROSS-REFERENCE TO RELATED APPLICATIONS

This application is a National Stage of International Application No. PCT/JP2018/047246, filed Dec. 21, 2018, which claims priority to Japanese Patent Application No. 2017-251163, filed Dec. 27, 2017, and the contents of which is incorporated by reference.

TECHNICAL FIELD

The present disclosure relates to a substrate with a conductive film, a substrate with a multilayer reflective film, a reflective mask blank, a reflective mask, and a semiconductor device manufacturing method for use in EUV lithography.

BACKGROUND ART

In the semiconductor industry, semiconductor devices have become more highly integrated in recent years, and fine patterns that exceed the transfer limit of conventional ultraviolet photolithography have been required accordingly. For achieving the formation of such fine patterns, extreme ultraviolet (hereinafter referred to as "EUV") lithography, which is an exposure technique using EUV light, is considered promising. Here, EUV light refers to light in the soft X-ray or vacuum ultraviolet band, and specifically refers to light having a wavelength of about 0.2 to 100 nm. Reflective masks have been proposed as transfer masks for use in this EUV lithography. Such reflective masks have a multilayer reflective film formed on a substrate to reflect exposure light, and also have a patterned absorber film that absorbs exposure light on the multilayer reflective film.

A reflective mask is manufactured by forming an absorber film pattern using photolithography or the like from a reflective mask blank having a substrate, a multilayer reflective film formed on the substrate, and an absorber film formed on the multilayer reflective film.

In general, a multilayer reflective film and an absorber film are formed using a film forming method such as sputtering. During the film formation, a reflective mask blank substrate is supported by a support means in a film forming device. An electrostatic chuck is used as a support means for the substrate. Therefore, on the back surface of the insulating reflective mask blank substrate such as a glass substrate (on the surface opposite to the front surface on which the multilayer reflective film and the like are formed), a conductive film (conductive back film) is formed to promote the fixing of the substrate by the electrostatic chuck.

As an example of a substrate with a conductive film, Patent Literature 1 discloses a substrate with a conductive film used for manufacturing a reflective mask blank for EUV lithography. Specifically, Patent Literature 1 describes a substrate with a conductive film characterized in that the conductive film contains chromium (Cr) and nitrogen (N), the average concentration of N in the conductive film is 0.1 at % or more and less than 40 at %, the crystal state of at least a surface of the conductive film is amorphous, the surface roughness (rms) of the conductive film is 0.5 nm or less, and the conductive film is a gradient composite film in which the N concentration in the conductive film changes in the thickness direction of the conductive film so that the N concentration on the substrate side is low and the N concentration on the surface side is high.

Patent Literature 2 describes a substrate with a conductive film used for manufacturing a reflective mask blank for EUV lithography. Specifically, Patent Literature 2 describes a substrate with a conductive film characterized in that the main material for the conductive film is at least one member selected from the group consisting of Cr, Ti, Zr, Nb, Ni, and V, the conductive film contains boron (B) at an average concentration of 1 to 70 at %, and the conductive film is a gradient composite film in which the concentration of B in the conductive film changes in the thickness direction of the conductive film so that the B average concentration on the substrate side is low and the B average concentration on the surface side is high.

Patent Literature 3 discloses a method for correcting an error of a transfer mask for photolithography. Specifically, Patent Literature 3 discloses a technique of locally irradiating the substrate of a transfer mask with femtosecond laser pulses, thereby modifying the surface or inside of the substrate to correct an error of the transfer mask. In Patent Literature 3, a laser for generating femtosecond laser pulses is exemplified by a sapphire laser (wavelength: 800 nm), an Nd-YAG laser (532 nm), and the like.

Patent Literature 4 describes a substrate for a photolithography mask that includes a coating deposited on the rear surface of the substrate. Patent Literature 4 discloses that the coating includes at least one first layer containing at least one metal and at least one second layer containing at least one metal nitride, and at least one first layer includes at least one conductive layer containing nickel (Ni), chromium (Cr), or titanium (Ti).

CITATION LIST

Patent Literature

Patent Literature 1: Japanese Patent No. 4978626
Patent Literature 2: Japanese Patent No. 5082857
Patent Literature 3: Japanese Patent No. 5883249
Patent Literature 4: Japanese Patent No. 6107829

SUMMARY OF DISCLOSURE

Patent Literature 3 describes a method for correcting an error of a photolithography mask using laser beams. A possible way of applying the technique described in Patent Literature 3 to a reflective mask is to radiate laser beams from the second main surface (back surface) side of the substrate. However, because a conductive back film (which may be simply referred to as a "conductive film") made of a material containing chromium (Cr) or the like is disposed on the second main surface of the substrate of the reflective mask, the second main surface may prevent laser beams from passing therethrough, which is problematic.

A pattern transfer device for manufacturing a semiconductor device usually includes an electrostatic chuck for fixing the reflective mask mounted on the stage. The conductive film formed on the back surface of the reflective mask is fixed to the stage of the pattern transfer device by the electrostatic chuck. Therefore, the conductive film needs to satisfy a predetermined mechanical strength. In the above-described pattern transfer device, if the moving speed of the stage on which the reflective mask is mounted is increased to enhance the production efficiency, a further load is applied to the conductive back film. Therefore, it is desired that the conductive back film have higher mechanical strength. In addition, it is preferable that the conductive back film satisfy the required values of the sheet resistance, surface roughness, and amount of deformation (CTIR) of the substrate due to film stress.

Accordingly, an aspect of the present disclosure is to provide a reflective mask having a conductive back film with high mechanical strength and enabling correction of a positional error of the reflective mask from the back surface side using laser beams or the like. Another aspect of the present disclosure is to obtain a substrate with a conductive film, a substrate with a multilayer reflective film, and a reflective mask blank for manufacturing a reflective mask having a conductive back film with high mechanical strength and enabling correction of a positional error of the reflective mask from the back surface side using laser beams or the like.

The inventors have found that in order to solve the above-mentioned problems, it is necessary to form a conductive back film using a material having a transmittance of 10% or more for light having a wavelength of at least 532 nm. A transparent conductive film can be used as a conductive film made of such a material. The inventors have also found that even when the mechanical strength of a transparent conductive film (transparent conductive layer) is insufficient, a film of a predetermined film thickness containing tantalum (Ta) and boron (B) can be formed as the upper layer of the conductive back film, whereby the mechanical strength required of the conductive back film can be achieved, and all the required values of the sheet resistance, surface roughness, and amount of deformation (CTIR) of the substrate due to film stress can be satisfied.

In order to solve the above-mentioned problems, the present disclosure has the following configurations.

(Configuration 1)

Configuration 1 of the present disclosure is a substrate with a conductive film, including a mask blank substrate for use in lithography and a conductive film formed on one main surface of the mask blank substrate. The conductive film includes a transparent conductive layer provided close to the substrate and an upper layer provided on the transparent conductive layer. The conductive film has a transmittance of 10% or more for light having a wavelength of 532 nm. The upper layer is made of a material containing tantalum (Ta) and boron (B), and the upper layer has a film thickness of 0.5 nm or more and less than 10 nm.

The conductive back film disposed on the substrate with a conductive film according to configuration 1 of the present disclosure can transmit laser beams having a wavelength of 532 nm, for example. The conductive back film according to configuration 1 of the present disclosure has high mechanical strength by including the predetermined upper layer. Therefore, according to configuration 1 of the present disclosure, it is possible to provide a substrate with a conductive film for manufacturing a reflective mask having a conductive back film with high mechanical strength and enabling correction of a positional error of the reflective mask from the back surface side using laser beams or the like.

(Configuration 2)

Configuration 2 of the present disclosure is the substrate with a conductive film according to configuration 1, wherein the upper layer has a smaller film thickness than the transparent conductive layer.

According to configuration 2 of the present disclosure, because the film thickness of the upper layer is small, absorption of laser beams in the upper layer can be reduced when a positional error of the reflective mask is corrected from the back surface side using laser beams or the like.

(Configuration 3)

Configuration 3 of the present disclosure is the substrate with a conductive film according to configuration 1 or 2, wherein the transparent conductive layer is made of a material containing titanium (Ti) and nitrogen (N).

According to configuration 3 of the present disclosure, because the transparent conductive layer is made of a material containing titanium (Ti) and nitrogen (N), the transparent conductive layer can have appropriate transmittance and conductivity.

(Configuration 4)

Configuration 4 of the present disclosure is the substrate with a conductive film according to any one of configurations 1 to 3, wherein the transparent conductive layer has a film thickness of 6 nm or more and 30 nm or less.

According to configuration 4 of the present disclosure, because the transparent conductive layer has a predetermined film thickness, the transparent conductive layer can have more appropriate transmittance and conductivity.

(Configuration 5)

Configuration 5 of the present disclosure is the substrate with a conductive film according to any one of configurations 1 to 4, wherein a root mean square roughness (Rms) of a surface of the conductive film obtained by measuring an area of 10 μm×10 μm with an atomic force microscope is 0.6 nm or less.

According to configuration 5 of the present disclosure, because a surface of the conductive film has a predetermined root mean square roughness (Rms), generation of particles due to friction between the electrostatic chuck and the conductive film can be prevented.

(Configuration 6)

Configuration 6 of the present disclosure is a substrate with a multilayer reflective film, including the substrate with a conductive film according to any one of configurations 1 to 5 and a multilayer reflective film formed on a main surface of the substrate opposite to the main surface on which the conductive back film is formed, the multilayer reflective film including high refractive index layers and low refractive index layers alternately layered.

According to configuration 6 of the present disclosure, EUV light having a predetermined wavelength can be reflected by the predetermined multilayer reflective film.

(Configuration 7)

Configuration 7 of the present disclosure is the substrate with a multilayer reflective film according to configuration 6, wherein a protective film is formed on the multilayer reflective film.

According to configuration 7 of the present disclosure, the protective film formed on the multilayer reflective film can prevent damage to the multilayer reflective film surface when a reflective mask (EUV mask) is manufactured using the substrate with a multilayer reflective film, achieving good reflectance characteristics for EUV light.

(Configuration 8)

Configuration 8 of the present disclosure is a reflective mask blank including the substrate with a multilayer reflective film according to configuration 6 and an absorber film formed on the multilayer reflective film or on the protective film according to configuration 7.

According to configuration 8 of the present disclosure, because the absorber film of the reflective mask blank can absorb EUV light, the reflective mask (EUV mask) of the present disclosure can be manufactured by patterning the absorber film of the reflective mask blank.

(Configuration 9)

Configuration 9 of the present disclosure is a reflective mask obtained by patterning the absorber film of the reflective mask blank according to configuration 8 into an absorber pattern on the multilayer reflective film or on the protective film.

According to configuration 9 of the present disclosure, it is possible to obtain a reflective mask having a conductive back film with high mechanical strength and enabling correction of a positional error of the reflective mask from the back surface side using laser beams or the like.

(Configuration 10)

Configuration 10 of the present disclosure is a semiconductor device manufacturing method including a step of performing a lithography process with an exposure device using the reflective mask according to configuration 9 to form a transfer pattern on a transfer object.

According to the semiconductor device manufacturing method of configuration 10 of the present disclosure, a reflective mask having a conductive back film with high mechanical strength and enabling correction of a positional error of the reflective mask from the back surface side using laser beams or the like can be used for manufacturing a semiconductor device. Therefore, a semiconductor device having a fine and accurate transfer pattern can be manufactured.

According to the present disclosure, it is possible to provide a reflective mask having a conductive back film with high mechanical strength and enabling correction of a positional error of the reflective mask from the back surface side using laser beams or the like. According to the present disclosure, it is possible to obtain a substrate with a conductive film, a substrate with a multilayer reflective film, and a reflective mask blank for manufacturing a reflective mask having a conductive back film with high mechanical strength and enabling correction of a positional error of the reflective mask from the back surface side using laser beams or the like.

DESCRIPTION OF EMBODIMENTS

Hereinafter, an embodiment of the present disclosure will be described in detail with reference to the drawings. The following embodiment is a mode for embodying the present disclosure, and does not limit the present disclosure to the scope thereof.

The present disclosure is a substrate with a conductive film, including a mask blank substrate and a conductive film formed on one main surface of the mask blank substrate. Among the main surfaces of the mask blank substrate, the main surface on which the conductive film (also referred to as a "conductive back film") is formed is referred to as a "back surface". In addition, the present disclosure is a substrate with a multilayer reflective film, including the substrate with a conductive film and a multilayer reflective film formed on the main surface (which may be referred to as a "front surface") of the substrate on which the conductive back film is not formed. The multilayer reflective film includes high refractive index layers and low refractive index layers alternately layered.

In addition, the present disclosure is a reflective mask blank having a mask blank multilayer film including the substrate with a multilayer reflective film and an absorber film formed on the multilayer reflective film.

Figure 1:
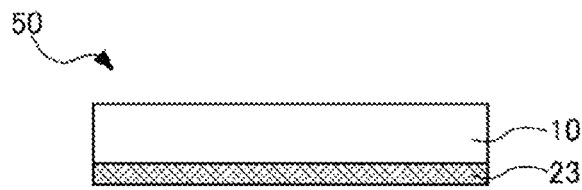
FIG. 1 is a schematic cross-sectional diagram illustrating an example of a configuration of a substrate with a conductive film according to an embodiment of the present disclosure.

FIG. 1 is a schematic diagram illustrating an example of a substrate with a conductive film 50 according to the present disclosure. The substrate with a conductive film 50 of the present disclosure has a structure in which a conductive back film 23 is formed on the back surface of a mask blank substrate 10. In the present description, the substrate with a conductive film 50 includes at least the mask blank substrate 10 and the conductive back film 23 formed on the back surface of the mask blank substrate 10. The substrate with a conductive film 50 can also include, for example, a multilayer reflective film 21 formed on the other main surface (substrate with a multilayer reflective film 20) and an absorber film 24 formed additionally on the other main surface (reflective mask blank 30). In the present description, the conductive back film 23 may be simply referred to as the conductive film 23.

Figure 2:
FIG. 2 is a schematic cross-sectional diagram illustrating an example of a configuration of a substrate with a multilayer reflective film according to an embodiment of the present disclosure.
Figure 3:
FIG. 3 is a schematic cross-sectional diagram illustrating an example of a configuration of a substrate with a multilayer reflective film (substrate with a conductive film) according to an embodiment of the present disclosure.

FIG. 2 is a diagram illustrating an example of a substrate with a multilayer reflective film 20. The multilayer reflective film 21 is formed on a main surface of the mask blank substrate 10 illustrated in FIG. 2. FIG. 3 is a diagram illustrating the substrate with a multilayer reflective film 20 having the conductive back film 23 formed on the back surface. The substrate with a multilayer reflective film 20 illustrated in FIG. 3 is a kind of substrate with a conductive film 50 because the conductive back film 23 is provided on the back surface.

Figure 6:
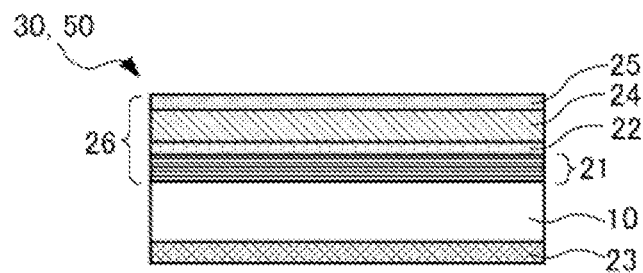
FIG. 6 is a schematic cross-sectional diagram illustrating another example of a configuration of a reflective mask blank according to an embodiment of the present disclosure.

FIG. 6 is a schematic diagram illustrating an example of the reflective mask blank 30 according to the present disclosure. The reflective mask blank 30 of the present disclosure has a mask blank multilayer film 26 on a main surface of the mask blank substrate 10. In the present description, the mask blank multilayer film 26 is a plurality of films including the multilayer reflective film 21 and the absorber film 24 layered on a main surface of the mask blank substrate 10 of the reflective mask blank 30. The mask blank multilayer film 26 can further include, for example, a protective film 22 formed between the multilayer reflective film 21 and the absorber film 24, and/or an etching mask film 25 formed on the surface of the absorber film 24. In the case of the reflective mask blank 30 illustrated in FIG. 6, the mask blank multilayer film 26 on a main surface of the mask blank substrate 10 has the multilayer reflective film 21, the protective film 22, the absorber film 24, and the etching mask film 25. In a case where the reflective mask blank 30 having the etching mask film 25 is used, the etching mask film 25 may be peeled off after a transfer pattern is formed on the absorber film 24 as described later. Further, instead of forming the etching mask film 25 in the reflective mask blank 30, the absorber film 24 may have a stack of layers made of materials having different etching characteristics, so that the absorber film 24 has the etching mask function for the reflective mask blank 30. The reflective mask blank 30 of the present disclosure includes the conductive back film 23 on the back surface. Therefore, the reflective mask blank 30 illustrated in FIG. 6 is a kind of substrate with a conductive film 50.

In the present description, "having the multilayer reflective film 21 on a main surface of the mask blank substrate 10" means not only that the multilayer reflective film 21 is disposed in contact with the front surface of the mask blank substrate 10 but also that another film is provided between the mask blank substrate 10 and the multilayer reflective film 21. The same applies to other films. For example, "having film B on film A" means not only that film A and film B are disposed in direct contact with each other but also that another film is provided between film A and film B. In the present description, for example, "film A is disposed in contact with a surface of film B" means that film A and film B are disposed in direct contact with each other without any film interposed therebetween. In the present description, "up" may mean a direction away from the mask blank substrate 10.

Figure 4:
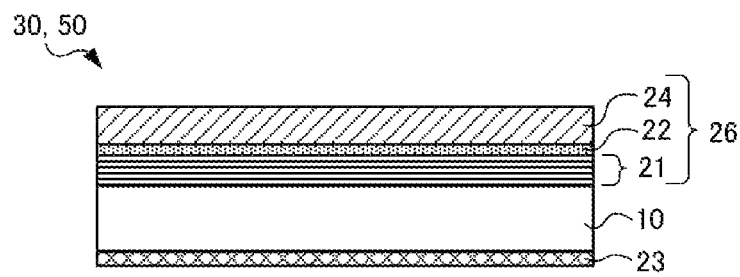
FIG. 4 is a schematic cross-sectional diagram illustrating an example of a configuration of a reflective mask blank according to an embodiment of the present disclosure.

FIG. 4 is a schematic diagram illustrating another example of the reflective mask blank 30 according to the present disclosure. In the case of the reflective mask blank 30 of FIG. 4, the mask blank multilayer film 26 has the multilayer reflective film 21, the protective film 22, and the absorber film 24, but does not have the etching mask film 25. The reflective mask blank 30 of FIG. 4 includes the conductive back film 23 on the back surface. Therefore, the reflective mask blank 30 illustrated in FIG. 4 is a kind of substrate with a conductive film 50.

Next, surface roughness (Rms), which is a parameter indicating the surface morphology of a surface of the mask blank substrate 10 and a surface of a film constituting the reflective mask blank 30 or the like, will be described.

Root mean square (Rms), which is a representative index of surface roughness, is root mean square roughness that is the square root of the mean squared deviation from a mean line to a measurement curve. Rms is expressed by Formula (1) below.

[Formula 1]

$$Rms = \sqrt{\frac{1}{l}\int_0^l Z^2(x)\,dx} \quad (1)$$

In Formula (1), l is a reference length, and Z is a height from a mean line to a measurement curve.

Rms is conventionally used for managing the surface roughness of the mask blank substrate 10 so that the surface roughness can be grasped numerically.

Next, coordinate total indicated reading (CTIR) will be described as a parameter indicating the amount of deformation of the substrate due to the film stress of a film constituting the reflective mask blank 30 or the like. First, the main surface (back surface) of the mask blank substrate 10 is measured before the formation of the conductive film 23, whereby the surface shape of the substrate without the conductive film 23 is acquired. Next, the surface of the substrate with a conductive film 50 including the conductive film 23 formed on the main surface (back surface) of the mask blank substrate 10 is measured, whereby the surface shape of the substrate with the conductive film 23 is acquired. The difference shape is calculated between the surface shape of the substrate 10 and the surface shape of the conductive film 23. CTIR is the absolute value of the difference between the highest and lowest values of the difference shape.

The surface shape can be measured using a surface shape analysis device (surface shape measuring device). A publicly known method can be used for measuring the surface shape. It is preferable to use a surface shape measurement method utilizing interference fringes of radiated light because the surface shape can be accurately measured in a short time. Such a device for measuring the surface shape irradiates the entire measurement area of an object to be measured with test light having a strong coherent tendency such as laser light, generates an interference fringe image between the light reflected by the surface and the light reflected by a reference surface having a high flatness, and subjects the interference fringe image to image analysis to acquire the surface shape of the substrate. As such a device (surface shape analysis device), for example, UltraFLAT 200M (manufactured by Corning TROPEL Corporation) can be used.

The surface shape can be measured typically with the following method. First, measurement points are disposed in a grid on the surface of the measurement object, and height information of each measurement point (the reference surface therefor is, for example, the reference plane of the measuring device) is acquired by the surface shape measuring device. Next, a surface (least square plane) approximated by the least square method is calculated based on the height information of each measurement point and set as a reference surface. Next, the height information of each measurement point is converted to the height of each measurement point relative to the reference surface (least square plane), and the result is set as information on the surface shape at each measurement point.

The size of the surface shape measurement area can be appropriately selected in accordance with the size of the substrate, the size of the pattern for use as a reflective mask, the size of the electrostatic chuck, and the like. Here, the measurement area is 132 mm×132 mm.

Next, the substrate with a conductive film 50, the substrate with a multilayer reflective film 20, the reflective mask blank 30, and a reflective mask 40 of the present disclosure will be described in more detail. First, the mask blank substrate 10 (which may be simply referred to as the "substrate 10") used for the substrate with a conductive film 50, the substrate with a multilayer reflective film 20, the reflective mask blank 30, and the reflective mask 40 of the present disclosure will be described.

[Mask Blank Substrate 10]

As the substrate 10, a substrate having a low coefficient of thermal expansion in the range of 0±5 ppb/° C. is preferably used in order to prevent distortion of an absorber pattern 24a due to heat during exposure to EUV light. As a material having a low coefficient of thermal expansion in this range, for example, $SiO_2$—$TiO_2$-based glass, multi-component glass ceramics, and the like can be used.

The first main surface of the substrate 10 on which a transfer pattern (absorber pattern 24a described later) is formed is subjected to surface treatment so as to have a high flatness from the viewpoint of obtaining at least pattern transfer accuracy and position accuracy. In the case of EUV exposure, the main surface of the substrate 10 on which a transfer pattern is formed preferably has a flatness of 0.1 µm or less, more preferably 0.05 µm or less, and still more preferably 0.03 µm, in an area of 132 mm×132 mm. The second main surface opposite to the first main surface is the surface to be electrostatically chucked on the exposure device. The second main surface preferably has a flatness of 0.1 µm or less, more preferably 0.05 µm or less, and still more preferably 0.03 µm or less, in an area of 132 mm×132 mm. Note that the flatness of the second main surface side of the reflective mask blank 30 is preferably 1 µm or less, more preferably 0.5 µm or less, and still more preferably 0.3 µm or less, in an area of 142 mm×142 mm.

High surface smoothness is also an extremely important item for the substrate 10. The surface roughness of the first main surface on which the absorber pattern 24a for transfer is formed is preferably a root mean square roughness (RMS) of 0.1 nm or less. Note that surface smoothness can be measured with an atomic force microscope.

Further, the substrate 10 preferably has high rigidity so as not to be deformed due to the film stress of a film (such as the multilayer reflective film 21) formed thereon. In particular, the substrate 10 preferably has a high Young's modulus of 65 GPa or more.

The substrate with a multilayer reflective film 20 of the present disclosure can have a base film in contact with the front surface of the substrate 10. The base film is a thin film formed between the substrate 10 and the multilayer reflective film 21. The base film can serve to prevent charge-up at the time of mask pattern defect inspection with electron beams and to ensure that the multilayer reflective film 21 has few phase defects and high surface smoothness.

A preferable material for the base film is a material mainly containing ruthenium or tantalum. For example, Ru metal alone or Ta metal alone may be used, or a Ru or Ta alloy containing Ru or Ta and metal such as titanium (Ti), niobium (Nb), molybdenum (Mo), zirconium (Zr), yttrium (Y), boron (B), lanthanum (La), cobalt (Co), and/or rhenium (Re) may be used. The film thickness of the base film can be set within a range that does not adversely affect the transmittance of the conductive back film 23 for predetermined light. The film thickness of the base film can be, for example, in the range of 1 nm to 10 nm.

[Substrate with a Multilayer Reflective Film 20]

Next, the substrate with a multilayer reflective film 20 that can be used for the substrate with a conductive film 50 and the reflective mask blank 30 of the present disclosure will be described below.

FIG. 2 is a schematic diagram illustrating an example of the substrate with a multilayer reflective film 20 that can be used for the substrate with a conductive film 50 and the reflective mask blank 30 of the present disclosure. FIG. 3 is a schematic diagram illustrating another example of the substrate with a multilayer reflective film 20 of the present disclosure. As illustrated in FIG. 3, the substrate with a multilayer reflective film 20 having the predetermined conductive back film 23 is a kind of a substrate with a conductive film 50 of the present disclosure. In the present description, both the substrates with a multilayer reflective film 20 illustrated in FIGS. 2 and 3 are referred to as the substrate with a multilayer reflective film 20 of the present embodiment.

<Multilayer Reflective Film 21>

The substrate with a multilayer reflective film 20 of the present embodiment has the multilayer reflective film 21 formed on the main surface opposite to the main surface on which the conductive back film 23 is formed. The multilayer reflective film 21 includes high refractive index layers and low refractive index layers alternately layered. The substrate with a multilayer reflective film 20 of the present embodiment can reflect EUV light of a predetermined wavelength by having the predetermined multilayer reflective film 21.

Note that, as illustrated in FIG. 2, in the present disclosure, the multilayer reflective film 21 can be formed before the conductive back film 23 is formed. Alternatively, the conductive back film 23 may be formed as illustrated in FIG. 1, and then the multilayer reflective film 21 may be formed as illustrated in FIG. 3.

The multilayer reflective film 21 provides the reflective mask 40 with a function that reflects EUV light. The multilayer reflective film 21 is configured as a multilayer film in which layers mainly containing elements having different refractive indexes are periodically layered.

Generally, as the multilayer reflective film 21, a multilayer film is used in which thin films (high refractive index layers) of a light element that is a high refractive index material or a compound of the light element and thin films (low refractive index layers) of a heavy element that is a low refractive index material or a compound of the heavy element are alternately layered for about 40 to 60 periods. The multilayer film may be formed by counting, as one period, a stack of a high refractive index layer and a low refractive index layer in which the high refractive index layer and the low refractive index layer are layered in this order from the substrate 10 and building up stacks for a plurality of periods. Alternatively, the multilayer film may be formed by counting, as one period, a stack of a low refractive index layer and a high refractive index layer in which the low refractive index layer and the high refractive index layer are layered in this order from the substrate 10 and building up stacks for a plurality of periods. Note that the layer of the outermost surface of the multilayer reflective film 21 (that is, the surface layer of the multilayer reflective film 21 farthest from the substrate 10) is preferably a high refractive index layer. In the multilayer film described above, in a case where a stack (high refractive index layer and low refractive index layer) in which a high refractive index layer and a low refractive index layer are layered in this order on the substrate 10 is counted as one period and stacks are built up for a plurality of periods, the uppermost layer is a low refractive index layer. Since the low refractive index layer of the outermost surface of the multilayer reflective film 21 is easily oxidized, the reflectance of the multilayer reflective film 21 decreases. In order to avoid a decrease in the reflectance, it is preferable to further form a high refractive index layer on the uppermost low refractive index layer to form the multilayer reflective film 21. Meanwhile, in the multilayer film described above, in a case where a stack (low refractive index layer and high refractive index layer) in which a low refractive index layer and a high refractive index layer are layered in this order on the substrate 10 is counted as one period and stacks are built up for a plurality of periods, the uppermost layer is a high refractive index layer. In this case, there is no need to further form a high refractive index layer.

In the present embodiment, a layer containing silicon (Si) is employed as a high refractive index layer. As a material containing Si, in addition to Si alone, a Si compound containing Si and boron (B), carbon (C), nitrogen (N), and/or oxygen (O) can be used. By using a layer containing Si as a high refractive index layer, the reflective mask 40 for EUV lithography having excellent EUV light reflectance can be obtained. In addition, in the present embodiment, a glass substrate is preferably used as the substrate 10. Si also has excellent adhesion to the glass substrate. In addition, as a low refractive index layer, metal alone selected from molybdenum (Mo), ruthenium (Ru), rhodium (Rh), and platinum (Pt), or an alloy thereof is used. For example, as the multilayer reflective film 21 for EUV light having a wavelength of 13 nm to 14 nm, a Mo/Si periodic layered film in which Mo films and Si films are alternately layered for about 40 to 60 periods is preferably used. Note that the uppermost high refractive index layer of the multilayer reflective film 21 can be formed using silicon (Si), and a silicon oxide layer containing silicon and oxygen can be formed between the uppermost layer (Si) and the Ru-based protective film 22. By forming the silicon oxide layer, the cleaning resistance of the reflective mask 40 can be improved.

The reflectance of the multilayer reflective film 21 alone is usually 65% or more, and the upper limit thereof is usually 73%. The thickness and period of each constituent layer of the multilayer reflective film 21 can be appropriately selected in accordance with the exposure wavelength, for example, so as to satisfy Bragg's law of reflection. The multilayer reflective film 21 includes a plurality of high refractive index layers and a plurality of low refractive index layers. The plurality of high refractive index layers need not have the same thickness, and the plurality of low refractive index layers need not have the same thickness. Further, the film thickness of the Si layer of the outermost surface of the multilayer reflective film 21 can be adjusted within a range that does not reduce the reflectance. The film thickness of the outermost surface Si (high refractive index layer) can be in the range of 3 nm to 10 nm.

A method for forming the multilayer reflective film 21 is publicly known. For example, the multilayer reflective film 21 can be formed by forming each layer of the multilayer reflective film 21 with ion beam sputtering. In the case of the above-described Mo/Si periodic multilayer film, for example, by ion beam sputtering, first, a Si film having a thickness of about 4 nm is formed on the substrate 10 using a Si target, and then a Mo film having a thickness of about 3 nm is formed using a Mo target. With the Si film and the Mo film counted as one period, Si films and Mo films are layered for 40 to 60 periods to form the multilayer reflective film 21 (the layer of the outermost surface is a Si layer). In addition, when the multilayer reflective film 21 is formed, it is preferable to form the multilayer reflective film 21 by supplying krypton (Kr) ion particles from an ion source and performing ion beam sputtering.

<Protective Film 22>

In the substrate with a multilayer reflective film 20 of the present embodiment, it is preferable that the mask blank multilayer film 26 further include the protective film 22 disposed in contact with the surface of the multilayer reflective film 21 that does not face the mask blank substrate 10.

The protective film 22 is formed on the multilayer reflective film 21 in order to protect the multilayer reflective film 21 from dry etching and cleaning in the manufacturing procedure for the reflective mask 40 to be described later. In addition, when a black defect of the absorber pattern 24a is corrected using electron beams (EB), the multilayer reflective film 21 can be protected by the protective film 22. The protective film 22 can have a stack of three or more layers. For example, the protective film 22 can have a structure in which the lowermost layer and the uppermost layer of the protective film 22 are layers including a substance containing Ru, and metal other than Ru or an alloy of metal other than Ru is interposed between the lowermost layer and the uppermost layer. A material for the protective film 22 includes, for example, a material mainly containing ruthenium. As a material mainly containing ruthenium, for example, Ru metal alone or a Ru alloy containing Ru and metal such as titanium (Ti), niobium (Nb), molybdenum (Mo), zirconium (Zr), yttrium (Y), boron (B), lanthanum (La), cobalt (Co), and/or rhenium (Re) can be used. In addition, these materials for the protective film 22 can further contain nitrogen. The protective film 22 is effective in a case where the absorber film 24 is patterned by dry etching of a Cl-based gas.

In a case where a Ru alloy is used as a material for the protective film 22, the Ru content ratio of the Ru alloy is 50 atomic % or more and less than 100 atomic %, preferably 80 atomic % or more and less than 100 atomic %, and more preferably 95 atomic % or more and less than 100 atomic %. In particular, in a case where the Ru content ratio of the Ru alloy is 95 atomic % or more and less than 100 atomic %, sufficient EUV light reflectance can be secured while inhibiting the diffusion of an element (silicon) constituting the multilayer reflective film 21 to the protective film 22. Further, the protective film 22 can have a mask cleaning resistance, an etching stopper function for etching of the absorber film 24, and a protective function for preventing the multilayer reflective film 21 from changing with time.

In the case of EUV lithography, because there are few substances transparent to exposure light, EUV pellicles for preventing foreign matter from adhering to a mask pattern surface are not technically easy. For this reason, pellicleless operation that does not use pellicles has become the mainstream. In the case of EUV lithography, exposure contamination occurs, such as deposition of a carbon film on a mask or growth of an oxide film by EUV exposure. Therefore, when the EUV reflective mask 40 is used in the manufacture of a semiconductor device, it is necessary to frequently perform cleaning to remove foreign matter and contamination on the mask. For this reason, the EUV reflective mask 40 is required to have an order of magnitude more mask cleaning resistance than a transmissive mask for optical lithography. The use of the Ru-based protective film 22 containing Ti can significantly increase the cleaning resistance to cleaning liquids such as sulfuric acid, sulfuric acid hydrogen peroxide mixture (SPM), ammonia, ammonium hydrogen peroxide mixture (APM), OH radical cleaning water, and ozone water having a concentration of 10 ppm or less. Therefore, it is possible to satisfy the requirement for the mask cleaning resistance of the EUV reflective mask 40.

The thickness of the protective film 22 is not limited as long as the function as the protective film 22 can be fulfilled. From the viewpoint of EUV light reflectance, the thickness of the protective film 22 is preferably from 1.0 nm to 8.0 nm and more preferably from 1.5 nm to 6.0 nm.

As a method for forming the protective film 22, a method similar to a publicly known film forming method can be employed without any limitation. Specific examples of methods for forming the protective film 22 include sputtering and ion beam sputtering.

[Substrate with a Conductive Film 50]

Next, the substrate with a conductive film 50 of the present disclosure will be described. In the substrate with a multilayer reflective film 20 illustrated in FIG. 2, by forming the predetermined conductive back film 23 on the surface of the substrate 10 opposite to the surface in contact with the multilayer reflective film 21, the substrate with a conductive film 50 of the present disclosure illustrated in FIG. 3 can be obtained. Note that the substrate with a conductive film 50 of the present disclosure need not necessarily have the multilayer reflective film 21. As illustrated in FIG. 1, the substrate with a conductive film 50 of the present disclosure can also be obtained by forming the predetermined conductive back film 23 on one main surface of the mask blank substrate 10.

Figure 7:
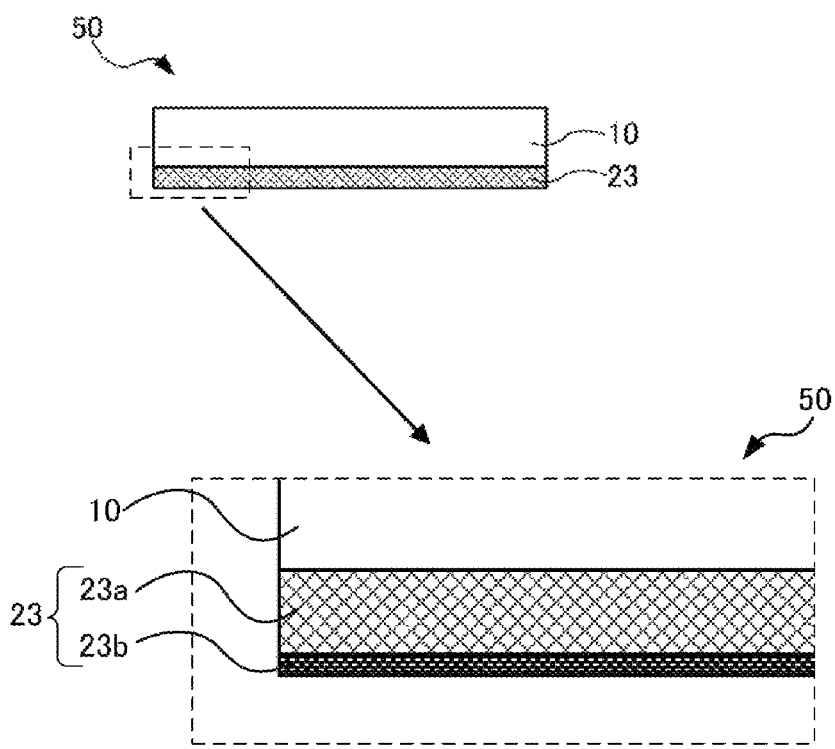
FIG. 7 is a schematic cross-sectional diagram illustrating the substrate with a conductive film according to an embodiment of the present disclosure illustrated in FIG. 1, in which a portion including the conductive film is enlarged.

In the substrate with a conductive film 50 of the present disclosure, the conductive film 23 (conductive back film 23) is formed on one main surface (back surface) of the mask blank substrate 10 for use in lithography. As illustrated in FIG. 7, the conductive film 23 includes a transparent conductive layer 23a provided close to the substrate and an upper layer 23b provided on the transparent conductive layer 23a. The conductive film 23 has a transmittance of 10% or more for light having a wavelength of 532 nm. The upper layer 23b is made of a material containing tantalum (Ta) and boron (B), and has a film thickness of 0.5 nm or more and less than 10 nm. Note that the upper layer 23b is a film of the conductive film 23 disposed in a direction further away from the mask blank substrate 10.

The conductive film 23 of the substrate with a conductive film 50 of the present disclosure includes the transparent conductive layer 23a provided close to the substrate 10. The transparent conductive layer 23a may be made of any material that has a predetermined value of transmittance for light having a wavelength of 532 nm and has a predetermined electric conductivity.

As a material for the transparent conductive layer 23a, it is preferable to use a transparent conductive film material such as tin-doped indium oxide (ITO), fluorine-doped tin oxide (FTO), aluminum-doped zinc oxide (AZO), or antimony-doped tin oxide (ATO). By setting the film thickness of the transparent conductive layer 23a to 50 nm or more, the electrical characteristics (sheet resistance) required of the conductive back film 23 for an electrostatic chuck can be set to 100Ω/□ (Ω/square) or less. For example, a 100-nm-thick ITO film has a transmittance of about 79.1% for light having a wavelength of 532 nm and a sheet resistance of 50μ/□.

In the substrate with a conductive film 50 of the present disclosure, the transparent conductive layer 23a is preferably made of a material containing titanium (Ti) and nitrogen (N). In the substrate with a conductive film 50 of the present disclosure, because the transparent conductive layer 23a is made of a material containing titanium and nitrogen, the transparent conductive layer 23a can have appropriate transmittance and conductivity.

In a case where the transparent conductive layer 23a is made of a material containing titanium and nitrogen, the total content of titanium and nitrogen in the material containing titanium and nitrogen is preferably 95 atomic % or more. The material containing titanium and nitrogen preferably contains more titanium than titanium nitride having a stoichiometric composition. That is, the ratio of the atomic percentage of titanium and the atomic percentage of nitrogen (atomic percentage of nitrogen/atomic percentage of titanium) in the material for the transparent conductive layer 23a is less than 1, preferably 0.95 or less, and more preferably 0.9 or less. Because the material for the transparent conductive layer 23a contains a relatively large amount of titanium, the electric conductivity of the material for the transparent conductive layer 23a can be increased. Therefore, the sheet resistance of the transparent conductive layer 23a can be reduced.

The transparent conductive layer 23a formed of a material containing titanium and nitrogen can be a uniform film in which the concentrations of titanium and nitrogen are uniform except in the surface layer that is affected by surface oxidation. In addition, a composite gradient film in which the concentration of titanium and/or nitrogen in the transparent conductive layer 23a changes in the thickness direction of the transparent conductive layer 23a can be used.

A material containing titanium and nitrogen for forming the transparent conductive layer 23a may further contain metal other than titanium as long as the effects of the present disclosure are not impaired. Examples of metals other than titanium include metals having high conductivity, such as Ag, Au, Cu, Al, Mg, W, and Co. A material containing titanium and nitrogen for forming the transparent conductive layer 23a preferably does not contain nonmetals other than nitrogen (for example, oxygen, boron, and the like). In particular, a material containing boron reduces both the transmittance and the electric conductivity. Therefore, a material containing titanium and nitrogen for forming the transparent conductive layer 23a preferably does not contain boron.

In terms of the diffraction peak intensity by X-ray diffraction, the transparent conductive layer 23a made of a material containing titanium and nitrogen preferably has a ratio $(I_r)$ of 0.4 or more, more preferably 0.5 or more, and still more preferably 0.7 or more, where the ratio $(I_r)$ is obtained by dividing the value $I_{(200)}$ of the diffraction peak intensity of TiN (200) by the sum of the value $I_{(200)}$ of the diffraction peak intensity of TiN (200) and the value $I_{(111)}$ of the diffraction peak intensity of TiN (111). The ratio $(I_r)$ can be calculated by the following formula.

$$I_r = I_{(200)} / [I_{(200)} + I_{(111)}]$$

In a material containing titanium and nitrogen, as the content of titanium increases, the value of the diffraction peak intensity of TiN (200) increases compared to the value of the diffraction peak intensity of TiN (111). When the ratio of the value of the diffraction peak intensity of TiN (200) is equal to or more than a predetermined ratio, it can be said that the titanium content in the transparent conductive layer 23a is a desirable value. Note that the "diffraction peak intensity" refers to the intensity of diffracted X-rays corresponding to a diffraction peak from a predetermined crystal plane during measurement of X-ray diffraction. The diffraction peak intensity is a value proportional to the area of a predetermined diffraction peak. In order to measure the area of a predetermined diffraction peak, processing such as subtraction of a predetermined background can be performed. Note that the diffraction peak intensity of TiN (200) and TiN (111) can be measured as follows. That is, using an X-ray diffractometer SmartLab (manufactured by Rigaku Corporation), a sample is irradiated with characteristic X-rays of CuKα generated at a voltage of 45 kV and a current of 200 mA, and the intensity and diffraction angle (2θ) of diffracted X-rays are measured, whereby the diffraction peak of diffracted X-rays corresponding to a predetermined crystal plane can be obtained. The diffraction peak intensity can be determined by measuring the area of a predetermined peak. At this time, processing such as subtraction of a predetermined background can be performed using software attached to the measuring device.

The film thickness of the transparent conductive layer 23a made of a material containing titanium and nitrogen is preferably 8 nm or more and 16 nm or less, more preferably 10 nm or more and 16 nm or less, and still more preferably 10 nm or more and 14 nm or less. Because the transparent conductive layer 23a made of a material containing titanium and nitrogen has a predetermined film thickness, the transparent conductive layer 23a can have more appropriate transmittance and conductivity. When the film thickness of the transparent conductive layer 23a made of a material containing titanium and nitrogen is 13 nm or less, the amount of deformation (CTIR) of the substrate due to film stress is in the range of 350±150 nm, which is preferable.

As a material for the transparent conductive layer 23a having high transmittance and electric conductivity, a material containing at least one metal can be used. At least one metal selected from nickel (Ni), chromium (Cr), aluminum (Al), gold (Au), silver (Ag), copper (Cu), titanium (Ti), tungsten (W), indium (In), platinum (Pt), molybdenum (Mo), rhodium (Rh), and zinc (Zn) can be used as a material for the transparent conductive layer 23a.

A metal compound containing any of these metals and at least one of boron, nitrogen, oxygen, and carbon can also be used as long as a desired transmittance and electrical characteristics are satisfied. The transparent conductive layer 23a made of a metal material has a higher electric conductivity than a transparent conductive film made of ITO or the like, and thus can be reduced in thickness. The film thickness of the transparent conductive layer 23a made of a metal material is preferably 50 nm or less and more preferably 20 nm or less, from the viewpoint of transmittance. Further, from the viewpoint that the sheet resistance tends to increase sharply as the film thickness becomes too small, and from the viewpoint of stability during film formation, the film thickness of the transparent conductive layer 23a made of a metal material is preferably 2 nm or more. For example, a 10.1-nm-thick Pt film has a transmittance of 20.3% for light having a wavelength of 532 nm and a sheet resistance of 25.3 Ω/□.

The film thickness of the transparent conductive layer 23a can be appropriately selected in accordance with the transmittance for light having a wavelength of 532 nm and the electric conductivity. For example, a material having high electric conductivity can contribute to reducing the film thickness and increasing the transmittance. Generally, the film thickness of the transparent conductive layer 23a of the substrate with a conductive film 50 of the present disclosure is preferably 6 nm or more and 30 nm or less. Because the transparent conductive layer 23a has a predetermined film thickness, the transparent conductive layer 23a can have more appropriate transmittance and conductivity.

Next, the upper layer 23b of the conductive back film 23 of the substrate with a conductive film 50 will be described.

As illustrated in FIG. 7, the conductive film 23 of the substrate with a conductive film 50 of the present disclosure includes the upper layer 23b provided on the side of the transparent conductive layer 23a that does not face the substrate 10. Because the conductive back film 23 includes the upper layer 23b, the mechanical strength of the conductive back film 23 can be increased.

In the substrate with a conductive film 50 of the present disclosure, the upper layer 23b of the conductive film 23 preferably has a smaller film thickness than the transparent conductive layer 23a. In the substrate with a conductive film 50 of the present disclosure, because the film thickness of the upper layer 23b is smaller than that of the transparent conductive layer 23a, absorption of laser beams in the upper layer 23b can be reduced when a positional error of the reflective mask 40 is corrected by irradiating the substrate 10 with laser beams or the like.

The upper layer 23b of the conductive back film 23 is made of a material containing tantalum (Ta) and boron (B). Because the conductive back film 23 includes the TaB film upper layer 23b, the mechanical strength of the conductive back film 23 can be further increased.

If the surface roughness of the surface of the transparent conductive layer 23a is rough, forming the TaB film upper layer 23b on the transparent conductive layer 23a is effective in smoothing the surface. For example, in a case where a TiN film is used as the conductive back film 23, the conductive back film 23 is likely to have a large surface roughness due to the crystal structure of the TiN film. Because a TaB film is amorphous, the surface roughness of the conductive back film 23 can be reduced by forming a TaB film on the TiN film.

Further, a TaB film is hardly soluble in acid and thus has cleaning resistance to cleaning with acid. Therefore, by using a TaB film as the upper layer 23b, the reflective mask 40 having cleaning resistance can be obtained with the transparent conductive layer 23a that may be soluble in acid.

Furthermore, a TaB film is preferably formed over a wider area than the transparent conductive layer 23a on a main surface of the substrate 10. Because the side wall of the transparent conductive layer 23a is covered with the TaB film and the material of the transparent conductive layer 23a is not exposed, the reflective mask 40 having more excellent cleaning resistance can be obtained.

The upper layer 23b preferably does not contain nitrogen and oxygen unless these are inevitably mixed and present during film formation or the like. This is because the control of film forming conditions for forming a TaB film with an appropriate film thickness and composition is easier on a material containing only two kinds of components Ta and B than on a material further containing nitrogen and/or oxygen. Therefore, the upper layer 23b preferably does not contain nitrogen and oxygen.

The film thickness of the upper layer 23b of the conductive back film 23 is preferably 0.5 nm or more in order to achieve a crack generation load value (described later) of greater than 500 mN, and more preferably 1.5 nm or more in order to achieve a crack generation load value of greater than 1000 mN. The film thickness of the upper layer 23b is preferably less than 10 nm and more preferably 5.5 nm or less. With the upper layer 23b having a film thickness of less than a predetermined film thickness, it is difficult to obtain a desired mechanical strength. With the upper layer 23b having a film thickness of greater than a predetermined film thickness, it is difficult to obtain a predetermined transmittance because the transmittance of the conductive back film 23 for light having a predetermined wavelength is reduced.

Even when the mechanical strength of the transparent conductive layer 23a is insufficient, the mechanical strength required of the conductive back film 23 can be obtained by setting the film thickness of the upper layer 23b made of a TaB film within the above range.

The film thickness of the conductive back film 23 including the transparent conductive layer 23a and the upper layer 23b is preferably 10 nm or more and 22 nm or less and more preferably 12 nm or more and 16 nm or less.

The transmittance of the conductive back film 23 including the transparent conductive layer 23a and the upper layer 23b for a wavelength of 532 nm is 10% or more, preferably 20% or more, and more preferably 25% or more. The transmittance for a wavelength of 632 nm is preferably 25% or more. Because the transmittance of the conductive back film 23 of the substrate with a conductive film 50 for light having a predetermined wavelength is within a predetermined range, it is possible to obtain the reflective mask 40 that enables correction of a positional error of the reflective mask 40 from the back surface side using laser beams or the like.

In the present description, transmittance is obtained by irradiating the substrate with a conductive film 50 including the conductive film 23 with light having a wavelength of 532 nm or 632 nm through the conductive film 23, and measuring the transmitted light that has passed through the conductive film 23 and the substrate 10.

The sheet resistance of the conductive film 23 including the transparent conductive layer 23a and the upper layer 23b is preferably 210Ω/☐ or less, more preferably 150Ω/☐ or less, and still more preferably 130Ω/☐ or less. Because the sheet resistance is within a predetermined range, the electrical characteristics required of the conductive film 23 for an electrostatic chuck can be satisfied. The sheet resistance of the conductive film 23 can be controlled by adjusting the composition and film thickness of the transparent conductive layer 23a and the upper layer 23b.

The surface roughness of the conductive film 23 including the transparent conductive layer 23a and the upper layer 23b (surface roughness of the upper layer 23b) is preferably a root mean square roughness (Rms), which is obtained by measuring an area of 10 μm×10 μm with an atomic force microscope, of 0.6 nm or less and more preferably 0.3 nm or less. Because the surface of the conductive film 23 has a predetermined root mean square roughness (Rms), generation of particles due to friction between the electrostatic chuck and the conductive film 23 can be prevented.

The surface shape of the surface of the conductive film 23 including the transparent conductive layer 23a and the upper layer 23b (surface of the upper layer 23b) is a convex shape, and the amount of deformation (CTIR) of the substrate due to film stress in an area of 132 mm×132 mm is preferably within the range of 350 nm 300 nm and more preferably within the range of 350 nm 150 nm.

The mechanical strength of the conductive film 23 including the transparent conductive layer 23a and the upper layer 23b can be evaluated by measuring the crack generation load of the substrate with a conductive film 50. For example, in a case where the moving speed of the stage on which the reflective mask is mounted is increased in order to enhance the production efficiency, the load on the conductive film 23 increases, so the conductive film 23 requires higher mechanical strength. The mechanical strength is preferably greater than a crack generation load value of 500 mN, more preferably greater than 700 mN, still more preferably greater than 1000 mN, even more preferably greater than 1300 mN, and most preferably greater than 2000 mN. When the crack generation load is within a predetermined range, it can be said that the conductive back film 23 has the mechanical strength required of the conductive film 23 for an electrostatic chuck. The method for measuring a crack generation load will be described later.

A method for forming the conductive back film 23 is publicly known. The conductive back film 23 can be formed, for example, by magnetron sputtering or ion beam sputtering using a target of a predetermined metal or alloy. For example, for forming the TiN film transparent conductive layer 23a, a Ti target is used, and Ar gas and $N_2$ gas are introduced as sputtering gases. By adjusting the flow ratio of Ar gas and $N_2$ gas for film formation and forming the film at a low pressure, a TiN film with a low degree of nitridation can be obtained. Further, by forming the transparent conductive layer 23a and the upper layer 23b at a low pressure, it is possible to increase the force of adhesion to the substrate and increase the crack generation load.

A preferable method for forming the transparent conductive layer 23a and the upper layer 23b of the conductive back film 23 specifically involves directing upward the film formation surface of the substrate 10 for forming the transparent conductive layer 23a or the upper layer 23b, rotating the substrate 10 on a horizontal plane, inclining the sputtering target at a predetermined angle with respect to the film formation surface at a position where the center axis of the substrate 10 and a straight line passing through the center of the sputtering target and parallel to the center axis of the substrate 10 are shifted, and forming the transparent conductive layer 23a or the upper layer 23b. With the sputtering target and the substrate 10 disposed in such a manner, the facing sputtering target is sputtered, whereby the transparent conductive layer 23a or the upper layer 23b can be formed. Regarding the predetermined angle, the inclination angle of the sputtering target is preferably 5 degrees or more and 30 degrees or less. The gas pressure during sputtering film formation is preferably 0.03 Pa or more and 0.1 Pa or less. By forming the transparent conductive layer 23a or the upper layer 23b with such a method, the conductive back film 23 having the mechanical strength required of the conductive film 23 for an electrostatic chuck can be obtained.

The reflective mask 40 can be manufactured using the substrate with a conductive film 50 of the present disclosure. The conductive film 23 of the substrate with a conductive film 50 of the present disclosure can transmit laser beams having a wavelength of 532 nm, for example. The conductive back film 23 disposed on the substrate with a conductive film 50 of the present disclosure has high mechanical strength by including the predetermined upper layer 23b. Therefore, according to the present disclosure, it is possible to obtain the substrate with a conductive film 50 for manufacturing the reflective mask 40 having the conductive back film 23 with high mechanical strength and enabling correction of a positional error of the reflective mask 40 from the back surface side using laser beams or the like.

[Reflective Mask Blank 30]

Next, the reflective mask blank 30 of the present disclosure will be described. FIG. 4 is a schematic diagram illustrating an example of the reflective mask blank 30 according to the present disclosure. The reflective mask blank 30 of the present disclosure has a structure in which the absorber film 24 is formed on the multilayer reflective film 21 or the protective film 22 of the above-described substrate with a multilayer reflective film 20. The reflective mask blank 30 can further have the etching mask film 25 and/or a resist film 32 on the absorber film 24 (see FIG. 8A).

<Absorber Film 24>

The reflective mask blank 30 has the absorber film 24 on the above-described substrate with a multilayer reflective film 20. That is, the absorber film 24 is formed on the multilayer reflective film 21 (or on the protective film 22 if the protective film 22 is formed). The basic function of the absorber film 24 is to absorb EUV light. The absorber film 24 may be the absorber film 24 designed to absorb EUV light, or may be the absorber film 24 having a phase shift function in consideration of the phase difference of EUV light. The absorber film 24 having the phase shift function absorbs EUV light and reflects part thereof to shift the phase. That is, in the reflective mask 40 on which the absorber film 24 having the phase shift function is patterned, the portion where the absorber film 24 is formed absorbs EUV light to attenuate light while reflecting some light at a level that does not adversely affect the pattern transfer. In the area (field portion) where the absorber film 24 is not formed, EUV light is reflected from the multilayer reflective film 21 via the protective film 22. Therefore, there is a desired phase difference between the reflected light from the absorber film 24 having the phase shift function and the reflected light from the field portion. The absorber film 24 having the phase shift function is formed such that the phase difference between the reflected light from the absorber film 24 and the reflected light from the multilayer reflective film 21 is in the range of 170 degrees to 190 degrees. Light beams having an inverted phase difference close to 180 degrees interfere with each other at the pattern edge portion, whereby the image contrast of the projection optical image is improved. As the image contrast is improved, the resolution is increased, and various tolerances relating to exposure such as exposure tolerance and focus tolerance can be increased.

The absorber film 24 may be a single-layer film or a multilayer film including a plurality of films (for example, a lower absorber film and an upper absorber film). A single-layer film is advantageous in reducing the number of processes for manufacturing a mask blank to enhance the production efficiency. For a multilayer film, the optical constant and film thickness can be appropriately set so that the upper absorber film can serve as an antireflection coating for mask pattern defect inspection using light. As a result, inspection sensitivity for mask pattern defect inspection using light is improved. In addition, a film containing oxygen (O), nitrogen (N), and the like that improve oxidation resistance can be used for the upper absorber film to improve the temporal stability. Thus, the absorber film 24 can be equipped with various functions in the form of a multilayer film. In addition, by using a multilayer film as the absorber film 24 having the phase shift function, the range of adjustment on the optical surface can be increased, so that a desired reflectance can be easily obtained.

Any material can be used for the absorber film 24, provided it has a function of absorbing EUV light and can be processed by etching or the like (preferably can be etched by dry etching of a chlorine (Cl) or fluorine (F)-based gas). As a material having such properties, tantalum (Ta) alone or a material containing Ta can be preferably used.

Examples of materials containing Ta can include a material containing Ta and B, a material containing Ta and N, a material containing Ta, B, and at least one of O and N, a material containing Ta and Si, a material containing Ta, Si, and N, a material containing Ta and Ge, a material containing Ta, Ge, and N, a material containing Ta and Pd, a material containing Ta and Ru, a material containing Ta and Ti, and the like.

The absorber film 24 can be formed, for example, by a material containing at least one member selected from the group consisting of Ni alone, a material containing Ni, Cr alone, a material containing Cr, Ru alone, a material containing Ru, Pd alone, a material containing Pd, Mo alone, and a material containing Mo.

In order to appropriately absorb EUV light, the absorber film 24 preferably has a thickness of 30 nm to 100 nm.

The absorber film 24 can be formed with a publicly known method, e.g. magnetron sputtering or ion beam sputtering.

<Etching Mask Film 25>

The etching mask film 25 may be formed on the absorber film 24. As a material for the etching mask film 25, a material having a high etching selectivity of the absorber film 24 to the etching mask film 25 is used. Here, "the etching selectivity of B to A" refers to the ratio of the etching rate of A, which is a layer that is not to be etched (layer serving as a mask), and the etching rate of B, which is a layer that is to be etched. Specifically, the etching selectivity of B to A is specified by the formula "etching selectivity of B to A=etching speed of B/etching speed of A". In addition, "high selectivity" means that a value of the selectivity defined above is large relative to the comparison object. The etching selectivity of the absorber film 24 to the etching mask film 25 is preferably 1.5 or more and more preferably 3 or more.

Examples of materials having a high etching selectivity of the absorber film 24 to the etching mask film 25 include a chromium material and a chromium compound material. Therefore, in a case where the absorber film 24 is etched with a fluorine-based gas, a chromium material and a chromium compound material can be used. A chromium compound can be, for example, a material containing Cr and at least one element selected from N, O, C, and H. In a case where the absorber film 24 is etched with a chlorine-based gas containing substantially no oxygen, a silicon material and a silicon compound material can be used. A silicon compound can be, for example, a material containing Si and at least one element selected from N, O, C, and H, and a metal silicon (metal silicide) and a metal silicon compound (metal silicide compound) containing metal in addition to silicon and a silicon compound. A metal silicon compound can be, for example, a material containing metal, Si, and at least one element selected from N, O, C, and H.

The film thickness of the etching mask film 25 is preferably 3 nm or more from the viewpoint of obtaining a function as an etching mask for accurately forming a transfer pattern on the absorber film 24. The film thickness of the etching mask film 25 is desirably 15 nm or less from the viewpoint of reducing the film thickness of the resist film 32.

[Reflective Mask 40]

Figure 5:
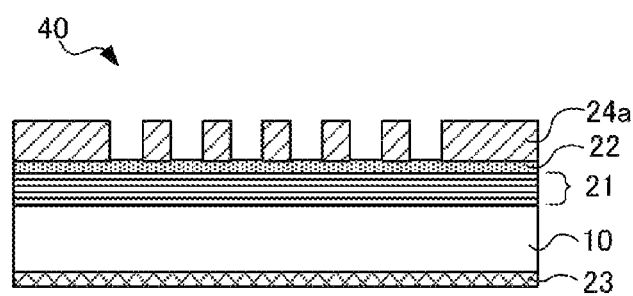
FIG. 5 is a schematic cross-sectional diagram illustrating an example of a reflective mask according to an embodiment of the present disclosure.

Next, the reflective mask 40 according to an embodiment of the present disclosure will be described below. FIG. 5 is a schematic diagram illustrating the reflective mask 40 of the present embodiment.

The reflective mask 40 of the present disclosure has a structure in which the absorber film 24 of the above-described reflective mask blank 30 is patterned to form the absorber pattern 24a on the multilayer reflective film 21 or on the protective film 22. When the reflective mask 40 of the present embodiment is exposed to exposure light such as EUV light, the exposure light is absorbed in a part of the surface of the reflective mask 40 where the absorber film 24 is present, and the exposure light is reflected by the protective film 22 and the multilayer reflective film 21 in the other part where the absorber film 24 has been removed, which is why the reflective mask 40 of the present embodiment can be used for lithography.

Because the reflective mask 40 of the present disclosure has the absorber pattern 24a on the multilayer reflective film 21 (or on the protective film 22), a predetermined pattern can be transferred to a transfer object using EUV light.

Because the reflective mask 40 of the present disclosure has a predetermined value of transmittance or more for a predetermined wavelength, a positional error of the reflective mask 40 of the present disclosure can be corrected using laser beams or the like with the method described in Patent Literature 3 (Japanese Patent No. 5883249). Therefore, it can be said that the reflective mask 40 of the present disclosure can have an accurate transfer pattern.

[Semiconductor Device Manufacturing Method]

Using the reflective mask 40 described above and a lithography process with an exposure device, a transfer pattern such as a circuit pattern that is based on the absorber pattern 24a of the reflective mask 40 is transferred to the resist film 32 formed on a transfer object such as a semiconductor substrate, and various other processes are performed, whereby a semiconductor device including various transfer patterns and the like formed on the transfer object such as the semiconductor substrate can be manufactured.

That is, the present disclosure is a semiconductor device manufacturing method including a step of performing a lithography process with an exposure device using the reflective mask 40 described above to form a transfer pattern on a transfer object.

According to the semiconductor device manufacturing method of the present disclosure, the reflective mask 40 that enables correction of a positional error of the reflective mask 40 from the back surface side using laser beams or the like with the method described in Patent Literature 3 (Japanese Patent No. 5883249) can be used for manufacturing a semiconductor device. Therefore, it can be said that a semiconductor device having a fine and accurate transfer pattern can be manufactured by using the reflective mask 40 of the present disclosure for manufacturing a semiconductor device.

EXAMPLES

Hereinafter, examples will be described with reference to the drawings.

First, the substrates with a conductive film 50 of examples and comparative examples will be described.

The substrate 10 for manufacturing the substrates with a conductive film 50 of the examples and comparative examples was prepared as follows. That is, the substrate 10 was prepared by polishing both the first main surface and the second main surface of a $SiO_2$—$TiO_2$-based glass substrate which is a low thermal expansion glass substrate of 6025 size (about 152 mm×152 mm×6.35 mm). The polishing involved rough polishing, precision polishing, local processing, and touch polishing so as to produce flat and smooth main surfaces.

On the second main surface (back surface) of the $SiO_2$—$TiO_2$-based glass substrate 10, the transparent conductive layer 23a made of a TiN film was formed using magnetron sputtering (reactive sputtering) under the following conditions. Table 1 shows the film thickness corresponding to each sample number.

Target: Ti target
Film formation gas: mixed gas atmosphere of Ar and $N_2$ (flow ratio, Ar:$N_2$=2:3).
Film formation gas pressure: 0.043 Pa
Film thickness: three types of 8 nm, 12 nm, or 16 nm (see Table 1)
Composition of a formed film: Ti:N=54:46

The upper layer 23b made of a TaB film was formed on the surface of the transparent conductive layer 23a using magnetron sputtering (reactive sputtering) under the following conditions. Table 1 shows the film thickness corresponding to each sample number.

Target: TaB target (Ta:B=80:20)
Film formation gas: Xe gas atmosphere (flow rate 2.5 sccm).
Film formation gas pressure: 0.019 Pa
Power for film formation: 1500 W
Film thickness: six types of 0 nm, 1 nm, 2 nm, 3.5 nm, 4.5 nm, or 5.5 nm (see Table 1)

For the examples and comparative examples obtained in the above-mentioned manner, Table 2 shows the sheet resistance (Q/), transmittance (%) for light having a wavelength of 532 nm, transmittance (%) for light having a wavelength of 632 nm, mechanical strength (crack generation load, unit: mN), surface roughness (Rms, unit: nm), and amount of deformation of the substrate due to film stress (CTIR, nm). Note that it was confirmed by CTIR measurement that all samples had a convex shape (i.e. the conductive film 23 was the outer part of the arc with respect to the substrate). For samples having a surface roughness of less than 0.6 nm, "<0.6" is described in Table 2.

Figure 9:
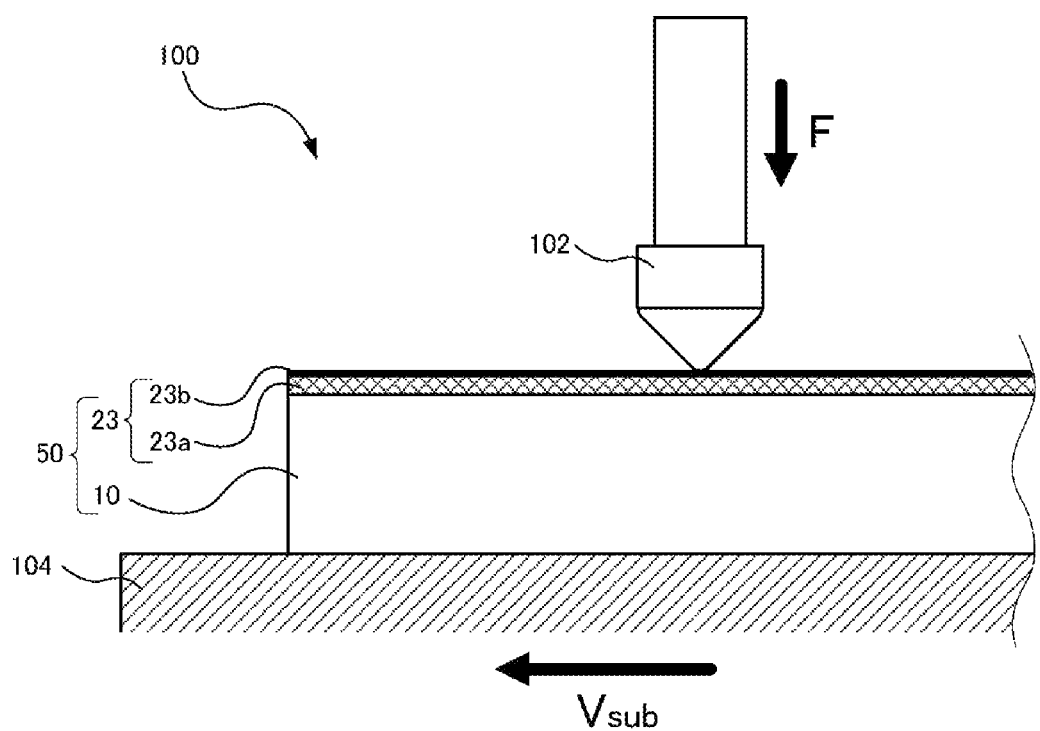
FIG. 9 is a schematic diagram for explaining measurement of a crack generation load.

For the evaluation of mechanical strength, the crack generation load of the substrates with a conductive film 50 of the examples and comparative examples was measured. FIG. 9 is a schematic diagram for explaining measurement of a crack generation load. A crack generation load can be measured as follows. That is, the substrate with a conductive film 50 is placed on a stage 104 of a crack generation load measuring device 100. Next, an indenter 102 is brought into contact with the conductive film 23 of the substrate with a conductive film 50. The indenter 102 is configured to be capable of applying a predetermined load to press the tip of the indenter 102 against the conductive film 23. The tip of the indenter 102 has a shape with a predetermined radius of curvature. Next, the stage 104 is moved at a predetermined speed while the load on the indenter 102 is increased at a predetermined speed. The load on the indenter 102 applied when a crack occurs in the conductive film 23 of the substrate with a conductive film 50 is defined as a crack generation load.

Conditions for measuring a crack generation load are as follows.

Initial load: 20 mN
Speed of increasing the load on the indenter 102: 400 mN/mm
Moving speed of the stage 104: 1 mm/min
Type of the indenter 102: Rockwell
Radius of curvature of the tip of the indenter 102: 20 μm As shown in Table 2, all the samples of the examples of the present disclosure had a crack generation load exceeding 500 mN, and samples 2 to 6, 9 to 12, and 15 to 18 had a crack generation load exceeding 1000 mN. On the other hand, all the samples of the comparative examples had a crack generation load of less than 500 mN, and the maximum crack generation load was 468 mN (sample 7). Therefore, it has become clear that the substrate with a conductive film 50 having the conductive back film 23 with high mechanical strength can be obtained by the present disclosure. Samples 5, 6, 8 to 12, and 14 to 18 satisfied the requirement for mechanical strength and had a sheet resistance of less than 150Ω/□. Samples 11 to 18 satisfied the requirement for mechanical strength and satisfied a CTIR of 350 nm 300 nm. Samples 2 to 6 and 8 to 10 satisfied the requirement for mechanical strength and satisfied a CTIR of 350 nm 150 nm.

Next, the substrates with a multilayer reflective film 20, the reflective mask blanks 30, and the reflective masks 40 of the examples and comparative examples will be described.

Using the substrate with a conductive film 50 manufactured as described above, the substrate with a multilayer reflective film 20 was manufactured by forming the multilayer reflective film 21 and the protective film 22 on the main surface (first main surface) of the substrate 10 opposite to the main surface on which the conductive back film 23 was formed. The reflective mask blank 30 was manufactured by forming the absorber film 24 on the protective film 22 of the substrate with a multilayer reflective film 20. Specifically, the substrate with a multilayer reflective film 20 and the reflective mask blank 30 were manufactured as described below.

The multilayer reflective film 21 was formed on the main surface (first main surface) of the substrate 10 opposite to the main surface on which the conductive back film 23 was formed. The multilayer reflective film 21 formed on the substrate 10 was the periodic multilayer reflective film 21 including Mo and Si in order to be the multilayer reflective film 21 suitable for EUV light having a wavelength of 13.5 nm. The multilayer reflective film 21 was formed by using a Mo target and a Si target and alternately layering Mo layers and Si layers on the substrate 10 by ion beam sputtering in an Ar gas atmosphere. First, a Si film was formed with a thickness of 4.2 nm, and then a Mo film was formed with a thickness of 2.8 nm. This formation was counted as one period, and Si films and Mo films were layered for 40 periods in a similar manner. Finally, a Si film was formed with a thickness of 4.0 nm and the multilayer reflective film 21 was formed. Here, the number of building-up periods was 40, but is not limited to this. The number of building-up periods can be, for example, 60. In a case where the number of building-up periods is 60, the number of processes is larger than the number of processes in the case of 40 periods, but the reflectance for EUV light can be increased.

Subsequently, the protective film 22 made of a Ru film was formed with a thickness of 2.5 nm by ion beam sputtering using a Ru target in an Ar gas atmosphere.

In the above-mentioned manner, the reflective mask blanks 30 of the examples and comparative examples of the present disclosure were manufactured.

Next, the absorber film 24 was formed on the protective film 22 of the substrate with a multilayer reflective film 20 by DC magnetron sputtering. The absorber film 24 was the layered absorber film 24 consisting of two layers: a TaBN film as an absorption layer and a TaBO film as a low reflection layer. The TaBN film was formed as an absorption layer on the surface of the protective film 22 of the above-described substrate with a multilayer reflective film 20 by DC magnetron sputtering. This TaBN film was subjected to reactive sputtering in a mixed gas atmosphere of Ar gas and $N_2$ gas, with the substrate with a multilayer reflective film 20 facing a TaB mixed sintered target (Ta:B=80:20, atomic ratio). Next, the TaBO film (low reflection layer) containing Ta, B, and O was further formed on the TaBN film by DC magnetron sputtering. This TaBO film, like the TaBN film, was subjected to reactive sputtering in a mixed gas atmosphere of Ar gas and $O_2$ gas, with the substrate with a multilayer reflective film 20 facing a TaB mixed sintered target (Ta:B=80:20, atomic ratio).

The composition of the TaBN film was Ta:B:N=74.7: 12.1:13.2, and the film thickness of the TaBN film was 56 nm. The composition of the TaBO film was Ta:B:O=40.7: 6.3:53.0, and the film thickness of the TaBO film was 14 nm.

In the above-mentioned manner, the reflective mask blanks 30 of the examples and comparative examples were manufactured.

Next, the reflective mask 40 was manufactured using the reflective mask blank 30 described above. FIGS. 8A-8D are schematic cross-sectional diagrams of a main part illustrating the procedure for producing the reflective mask 40 from the reflective mask blank 30.

Figure 8A:
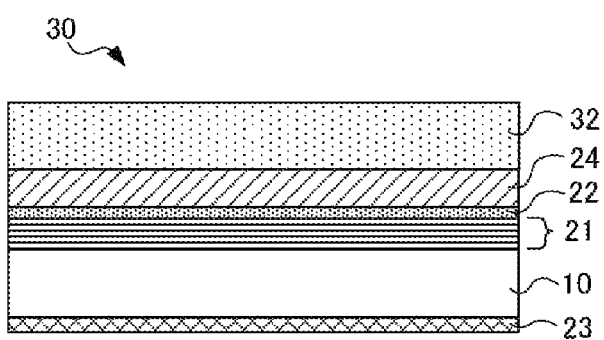
FIGS. 8A-8D are schematic cross-sectional process diagrams illustrating the procedure for producing a reflective mask from a reflective mask blank.
Figure 8B:
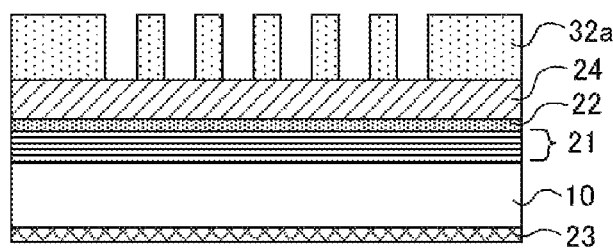
Figure 8C:
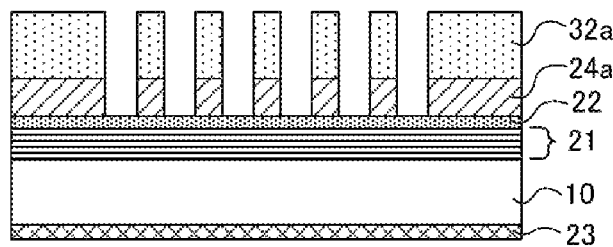

The reflective mask blank 30 was obtained by forming the resist film 32 with a thickness of 150 nm on the absorber film 24 of the above-described reflective mask blank 30 of the examples and comparative examples (FIG. 8A). A desired pattern was drawn (exposed) on the resist film 32, and further developed and rinsed to form the predetermined resist pattern 32a (FIG. 8B). Next, using the resist pattern 32a as a mask, the absorber film 24 was dry-etched to form the absorber pattern 24a (FIG. 8C). In a case where the absorber film 24 is a TaBN film, dry etching can be performed using a mixed gas of $Cl_2$ and He. In a case where the absorber film 24 is a layered film consisting of two layers of a TaBN film and a TaBO film, dry etching can be performed using a mixed gas of chlorine ($Cl_2$) and oxygen ($O_2$) (mixing ratio (flow ratio) of chlorine ($Cl_2$) and oxygen ($O_2$) is 8:2).

Figure 8D:
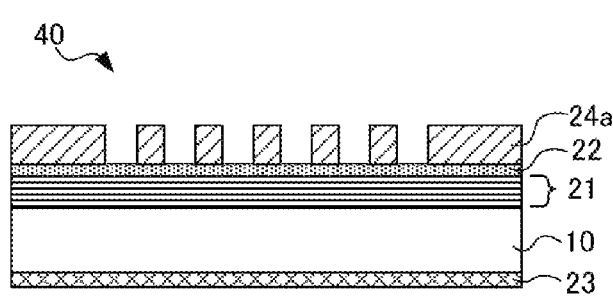

Thereafter, the resist pattern 32a was removed by ashing, resist stripping liquid, or the like. Finally, wet cleaning using pure water (DIW) was performed to produce the reflective mask 40 (FIG. 8D). If necessary, mask defect inspection can be performed after wet cleaning so that mask defects can be corrected appropriately.

As described in the evaluation of the above-described substrates with a conductive film 50 of the examples and comparative examples, the conductive films 23 of the examples of the present disclosure have a transmittance of more than 10% for light having a wavelength of 532 nm, enabling correction of a positional error of the reflective mask 40 using laser beams or the like as described in Patent Literature 3 (Japanese Patent No. 5883249). Therefore, it can be said that a semiconductor device having a fine and accurate transfer pattern can be manufactured by using the reflective mask 40 of the present disclosure for manufacturing a semiconductor device.

As described in the evaluation of the above-described substrates with a conductive film 50 of the examples and comparative examples, the conductive films 23 of the examples of the present disclosure have excellent mechanical strength. Therefore, the conductive film 23 of the reflective mask 40 of the present disclosure also has excellent mechanical strength. In addition, because the reflective mask 40 having the conductive back film 23 with high mechanical strength and enabling correction of a positional error of the reflective mask 40 from the back surface side using laser beams or the like can be used for manufacturing a semiconductor device, a semiconductor device having a fine and accurate transfer pattern can be manufactured.

The reflective mask 40 manufactured in the present examples was set on an EUV exposure device, and EUV exposure was performed on a wafer including a subject film and the resist film 32 formed on a semiconductor substrate. Then, by developing the exposed resist film 32, the resist pattern 32a was formed on the semiconductor substrate with the subject film.

This resist pattern 32a was transferred to the subject film by etching, and various processes such as formation of an insulating film and a conductive film, introduction of a dopant, and annealing were performed. The resultant semiconductor device successfully had desired characteristics.

TABLE 1

| | TaB film thickness | | | | | |
|---|---|---|---|---|---|---|
| | 0 nm | 1 nm | 2 nm | 3.5 nm | 4.5 nm | 5.5 nm |
| TiN film | 8 nm Sample 1 | Sample 2 | Sample 3 | Sample 4 | Sample 5 | Sample 6 |

TABLE 1-continued

| | | TaB film thickness | | | | |
|---|---|---|---|---|---|---|
| | | 0 nm | 1 nm | 2 nm | 3.5 nm | 4.5 nm | 5.5 nm |
| thickness | 12 nm | Sample 7 | Sample 8 | Sample 9 | Sample 10 | Sample 11 | Sample 12 |
| | 16 nm | Sample 13 | Sample 14 | Sample 15 | Sample 16 | Sample 17 | Sample 18 |

TABLE 2

| Sample number | Sheet resistance (Ω/□) | Transmittance for 532 nm (%) | Transmittance for 632 nm (%) | Crack generation load (mN) | Surface roughness (Rms) (nm) | CTIR (nm) | Notes |
|---|---|---|---|---|---|---|---|
| Sample 1 | 225.8 | 62.4 | 62.6 | 428 | 0.284 | 340 | Comparative example |
| Sample 2 | 206.8 | 55.4 | 55.6 | 1260 | <0.6 | 357 | Example |
| Sample 3 | 189.4 | 49.0 | 49.2 | 2006 | <0.6 | 374 | Example |
| Sample 4 | 159.3 | 38 | 38.2 | 2192 | 0.213 | 400 | Example |
| Sample 5 | 145.1 | 32.7 | 32.6 | 2356 | 0.259 | 418 | Example |
| Sample 6 | 131.5 | 27.9 | 28.2 | 2553 | 0.253 | 435 | Example |
| Sample 7 | 144.6 | 52.8 | 52.3 | 468 | 0.286 | 427 | Comparative example |
| Sample 8 | 136.9 | 47.3 | 46.9 | 899 | <0.6 | 444 | Example |
| Sample 9 | 130.0 | 42.2 | 41.8 | 1431 | <0.6 | 462 | Example |
| Sample 10 | 114 | 33.8 | 33.4 | 1564 | 0.228 | 488 | Example |
| Sample 11 | 119.5 | 28.7 | 28.4 | 1681 | <0.6 | 505 | Example |
| Sample 12 | 103.7 | 25.3 | 25.2 | 1822 | <0.6 | 522 | Example |
| Sample 13 | 94 | 43.6 | 42.4 | 427 | 0.315 | 530 | Comparative example |
| Sample 14 | 90.0 | 39.2 | 38.2 | 705 | <0.6 | 547 | Example |
| Sample 15 | 86.3 | 35.2 | 34.3 | 1122 | <0.6 | 565 | Example |
| Sample 16 | 79.7 | 28.5 | 28 | 1226 | 0.306 | 591 | Example |
| Sample 17 | 77.8 | 24.6 | 24.2 | 1352 | <0.6 | 608 | Example |
| Sample 18 | 73.1 | 21.7 | 21.4 | 1428 | <0.6 | 625 | Example |

REFERENCE SIGNS LIST 10 mask blank substrate
20 substrate with a multilayer reflective film
21 multilayer reflective film
22 protective film
23 conductive film (conductive back film)
23a transparent conductive layer
23b upper layer
24 absorber film
24a absorber pattern
25 etching mask film
26 mask blank multilayer film
30 reflective mask blank
32 resist film
32a resist pattern
40 reflective mask
50 substrate with a conductive film
100 crack generation load measuring device
102 indenter
104 stage

The invention claimed is:

1. A substrate with a conductive film, comprising:
a mask blank substrate for use in lithography; and
a conductive film formed on one main surface of the mask blank substrate, the conductive film including a conductive layer provided close to the substrate and an upper layer provided on the conductive layer, wherein
a sheet resistance of the conductive film is 210Ω/□ or less,
a mechanical strength of the conductive film is greater than a crack generation load value of 500 mN,
the upper layer contains tantalum (Ta) and boron (B), and
the upper layer has a film thickness of 0.5 nm or more and less than 10 nm.

2. The substrate with a conductive film according to claim 1, wherein the upper layer has a smaller film thickness than the conductive layer.

3. The substrate with a conductive film claim 1, wherein the conductive layer has a film thickness of 6 nm or more and 50 nm or less.

4. The substrate with a conductive film according to claim 1, wherein a root mean square roughness (Rms) of a surface of the conductive film obtained by measuring an area of 10 μm×10 μm with an atomic force microscope is 0.6 nm or less.

5. The substrate with a conductive film according to claim 1, wherein the upper layer is amorphous.

6. The substrate with a conductive film according to claim 1, wherein the conductive layer comprises at least one metal selected from nickel (Ni), chromium (Cr), aluminum (Al), gold (Au), silver (Ag), copper (Cu), titanium (Ti), tungsten (W), indium (In), platinum (Pt), molybdenum (Mo), rhodium (Rh), and zinc (Zn).

7. A substrate with a multilayer reflective film, comprising:
the substrate with a conductive film according to claim 1; and
a multilayer reflective film formed on a main surface of the substrate opposite to the main surface on which the conductive film is formed, the multilayer reflective film including high refractive index layers and low refractive index layers alternately layered,
wherein a refractive index of the high refractive index layers is higher than a refractive index of the low refractive index layers.

8. The substrate with a multilayer reflective film according to claim 7, wherein a protective film is formed on the multilayer reflective film.

9. A reflective mask blank comprising:
a substrate;
a conductive film formed on a main surface of the substrate, the conductive film including a conductive layer provided close to the substrate and an upper layer provided on the conductive layer;
a multilayer reflective film formed on a main surface of the substrate opposite to the main surface on which the conductive film is formed; and
an absorber film formed on the multilayer reflective film, wherein
a sheet resistance of the conductive film is 210Ω/□ or less,
a mechanical strength of the conductive film is greater than a crack generation load value of 500 mN,
the upper layer contains tantalum (Ta) and boron (B), and
the upper layer has a film thickness of 0.5 nm or more and less than 10 nm.

10. The reflective mask blank according to claim 9, further comprising a protective film formed between the multilayer reflective film and the absorber film.

11. The reflective mask blank according to claim 9, wherein the upper layer has a smaller film thickness than the conductive layer.

12. The reflective mask blank according to claim 9, wherein the conductive layer has a film thickness of 6 nm or more and 50 nm or less.

13. The reflective mask blank according to claim 9, wherein a root mean square roughness (Rms) of a surface of the conductive film obtained by measuring an area of 10 μm×10 μm with an atomic force microscope is 0.6 nm or less.

14. The reflective mask blank according to claim 9, wherein the upper layer is amorphous.

15. The reflective mask blank according to claim 9, wherein the conductive layer comprises at least one metal selected from nickel (Ni), chromium (Cr), aluminum (Al), gold (Au), silver (Ag), copper (Cu), titanium (Ti), tungsten (W), indium (In), platinum (Pt), molybdenum (Mo), rhodium (Rh), and zinc (Zn).

16. A reflective mask obtained by patterning the absorber film of the reflective mask blank according to claim 8 into an absorber pattern formed on the multilayer reflective film.

17. A semiconductor device manufacturing method comprising performing a lithography process with an exposure device, using the reflective mask according to claim 16, to form a transfer pattern on a transfer object.

18. The reflective mask according to claim 16, further comprising a protective film formed between the multilayer reflective film and the absorber pattern.

19. The reflective mask according to claim 16, wherein the upper layer has a smaller film thickness than the conductive layer.

20. The reflective mask according to claim 16, wherein the conductive layer has a film thickness of 6 nm or more and 50 nm or less.

21. The reflective mask according to claim 16, wherein a root mean square roughness (Rms) of a surface of the conductive film obtained by measuring an area of 10 μm×10 μm with an atomic force microscope is 0.6 nm or less.

22. The reflective mask according to claim 16, wherein the upper layer is amorphous.

23. The reflective mask according to claim 16, wherein the conductive layer comprises at least one metal selected from nickel (Ni), chromium (Cr), aluminum (Al), gold (Au), silver (Ag), copper (Cu), titanium (Ti), tungsten (W), indium (In), platinum (Pt), molybdenum (Mo), rhodium (Rh), and zinc (Zn).

* * * * *